United States Patent [19]
Frake et al.

[11] Patent Number: 5,166,858
[45] Date of Patent: Nov. 24, 1992

[54] CAPACITOR FORMED IN THREE CONDUCTIVE LAYERS

[75] Inventors: Scott O. Frake, Santa Clara; Roger D. Carpenter, Cupertino, both of Calif.

[73] Assignee: Xilinx, Inc., San Jose, Calif.

[21] Appl. No.: 785,391

[22] Filed: Oct. 30, 1991

[51] Int. Cl.$^5$ ............... H01G 4/10; H01L 27/02
[52] U.S. Cl. .................... 361/313; 257/516
[58] Field of Search ........... 29/25.42; 361/311–313; 357/51

[56] References Cited

U.S. PATENT DOCUMENTS

| | | | |
|---|---|---|---|
| 4,914,546 | 4/1990 | Alter | 361/313 |
| 4,994,688 | 2/1991 | Horiguchi et al. | 307/296.8 |
| 5,005,103 | 4/1991 | Kwon et al. | 357/51 X |

Primary Examiner—Donald A. Griffin
Attorney, Agent, or Firm—Edel M. Young

[57] ABSTRACT

A capacitor is formed in three adjacent conductive layers of a semiconductor integrated circuit chip. A first plate of the capacitor is formed in the middle layer. A second plate is formed in the upper and lower layers plus a small portion of the middle layer which interconnects the upper and lower layers and forms a U-shaped structure surrounding the first plate. These capacitors are preferably formed in pairs with the first plates interconnected. The second plates may be connected to different voltage supplies to form a capacitive voltage divider.

5 Claims, 6 Drawing Sheets

CAPACITOR FORMED IN THREE CONDUCTIVE LAYERS

FIELD OF THE INVENTION

The invention relates to integrated circuits, and to capacitors formed in an integrated circuit structure.

BACKGROUND OF THE INVENTION

Two common prior art voltage generators using a pumping technique, the voltage doubler and the voltage tripler, are shown in FIGS. 1 and 2, respectively. The names voltage doubler and voltage tripler are only roughly descriptive, and apply to the situation in which the diode drop is small with respect to the supply voltage (not always the case).

In FIG. 1, a steady state Vdd voltage is applied to the anode of diode D31 and generates a voltage at the cathode of diode D31 of at least Vdd minus VD31, where VD31 is the diode drop of diode D31. A square wave clock signal VCLK, which alternates between Vdd and ground, is applied to plate C31$b$ of capacitor C31. This varying signal on plate C31$b$ drives current to or from plate C31$a$. However, when voltage on capacitor plate C31$b$ is low, diode D31 allows current to flow from Vdd to plate C31$a$ and prevents the voltage on plate C31$a$ from going below Vdd-VD31. Likewise, if the voltage on plate C31$a$ rises more than one diode drop above the output voltage VLOAD, current flows through diode D32 to node N31. Thus the voltage level on capacitor plate C31$a$ varies between Vdd-VD31 and 2Vdd-VD31, and maintains the voltage VLOAD on node N31 at approximately 2Vdd-VD31-VD32.

Similarly, FIG. 2 shows a voltage tripler in which three diodes D41, D42, and D43 are placed in series as shown, and capacitors C41 and C42 apply clock signals at intermediate points N41 and N42 between successive diodes. Importantly, inverter I41 inverts the polarity of the VCLK signal so that the signal applied to capacitor C42 is out of phase with the signal applied to capacitor C41. As above, the voltage on node N41 varies between Vdd-VD41 and 2Vdd-VD41. Diode D42 becomes conductive if the voltage on node N42 goes below this varying signal by more than VD42, the diode drop of diode D42. Therefore the voltage on node N42 tends to rise to 2Vdd-VD42. When the voltage on VCLK goes high, current is driven from plate C41$a$ of capacitor C41 through diode D42 and onto plate C42$a$ of capacitor C42, which is being pulled to a low voltage by the low signal from inverter I41. Then as VCLK moves to a low (ground) voltage, the high voltage output from inverter I41 produces a corresponding high voltage on capacitor plate C42$a$, which in turn drives current through diode D43. Thus the voltage level of between Vdd-VD41 and 2Vdd-VD41 on node N41 results in a voltage level between approximately 2Vdd-VD41-VD42 and 3Vd-VD41-VD42 on node N42, and a final load voltage of approximately 3Vdd-VD41-VD42-VD43. A load capacitor can smooth this output signal.

Practically, in a 5-volt system, the voltage tripler circuit of FIG. 2 typically produces an output voltage somewhat above twice the supply voltage, and the circuit of FIG. 1 produces a voltage somewhat less than twice the supply voltage. In a simulation of a pumped system using a 5-volt power supply with NMOS diodes having a threshold voltage of 0.55 volts, and a body factor of 0.33 root-volts (body factor relates to the oxide thickness and doping, and determines the threshold at varying substrate voltages), the pumped voltages were as follows:

1-stage pump (doubler) 7.34 volts
2-stage pump (tripler) 10.71 volts
3-stage pump (quadrupler) 13.81 volts However, the circuits of FIGS. 1 and 2 generate unregulated voltages. The voltages generated by these circuits can vary considerably with both integrated circuit process variations and operating conditions. Regarding process variations, the manufacturing conditions week to week or from manufacturer to manufacturer produce variation from chip to chip. Fast silicon (with smaller diode drops) may cause a voltage tripler to generate too high a voltage, for example. Regarding variation in operating conditions, high temperature causes variations in voltage drop and on-resistance, and power supply voltage may vary from day to day or from site to site, producing corresponding variation in voltage generated by an unregulated voltage pump.

Because of these variations, a voltage doubler may generate insufficient voltage to achieve the desired benefits of the voltage pump, and a voltage tripler may generate a voltage which exceeds the transistor breakdown voltage. Thus, a voltage generator having a more reliable output voltage is needed.

SUMMARY OF THE INVENTION

The present invention provides a capacitor structure which can advantageously be used for generating a regulated voltage.

According to the invention, a capacitor is formed in three adjacent conductive layers of a semiconductor integrated circuit chip. A first plate of the capacitor is formed in the middle layer. A second plate is formed in the upper and lower layers plus a small portion of the middle layer which interconnects the upper and lower layers and forms a U-shaped structure surrounding the first plate. These capacitors are preferably formed in pairs with the first plates interconnected. The second plates may be connected to different voltage supplies to form a capacitive voltage divider.

DETAILED DESCRIPTION OF SOME PREFERRED EMBODIMENTS

Figure 3:
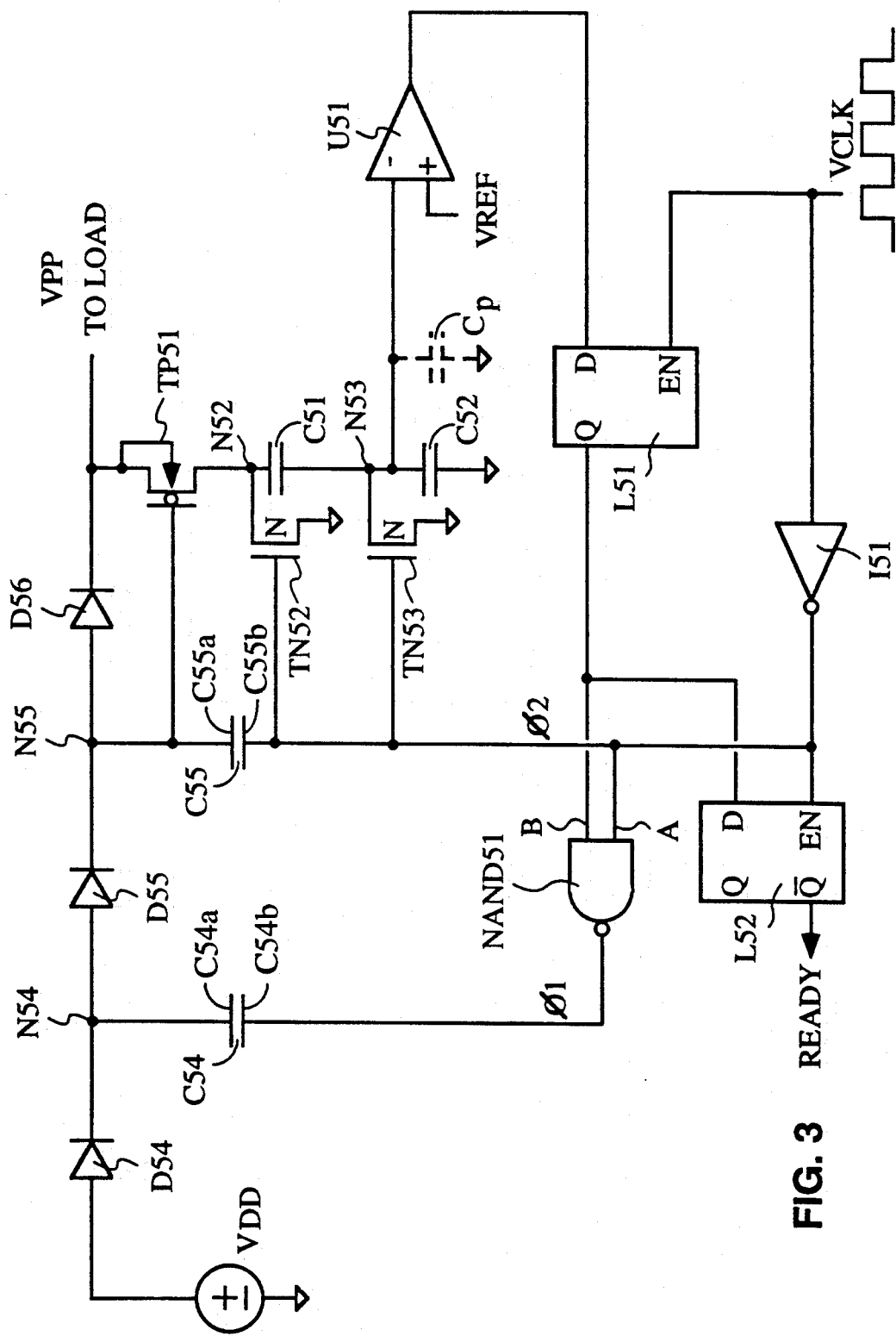
FIG. 3 shows a regulated voltage pump circuit which can benefit from the capacitor of the present invention.

As shown in FIG. 3, a supply voltage Vdd is applied to the anode of diode D54, which is connected at its cathode (node N54) to plate C54$a$ of capacitor C54 and to the anode of diode D55. Diode D55 is connected at its cathode (node N55) to plate C55$a$ of capacitor C55 and to the anode of diode D56. The cathode of diode D56 provides the output signal Vpp. The voltage on plate C55a of capacitor C55 is pumped by the voltage applied to plate C55b by inverted clock signal VCLK.

Figure 1:
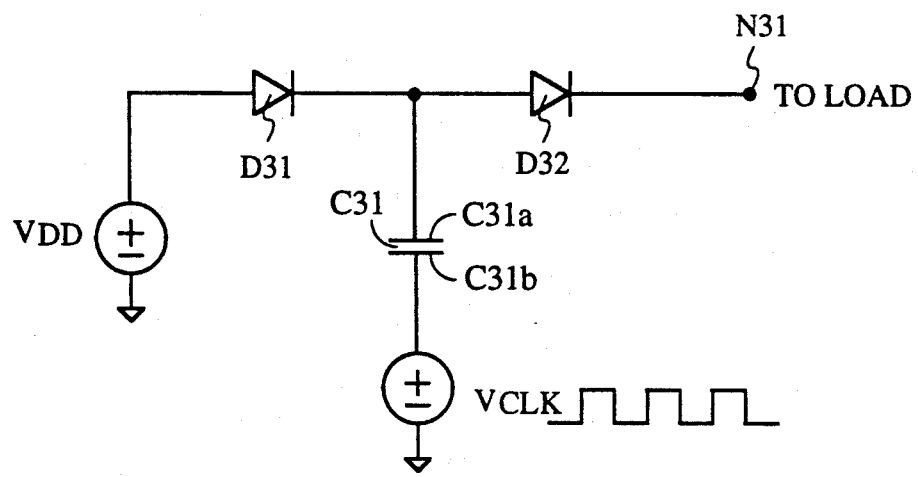
FIGS. 1 and 2 show prior art unregulated voltage pump circuits.
Figure 2:
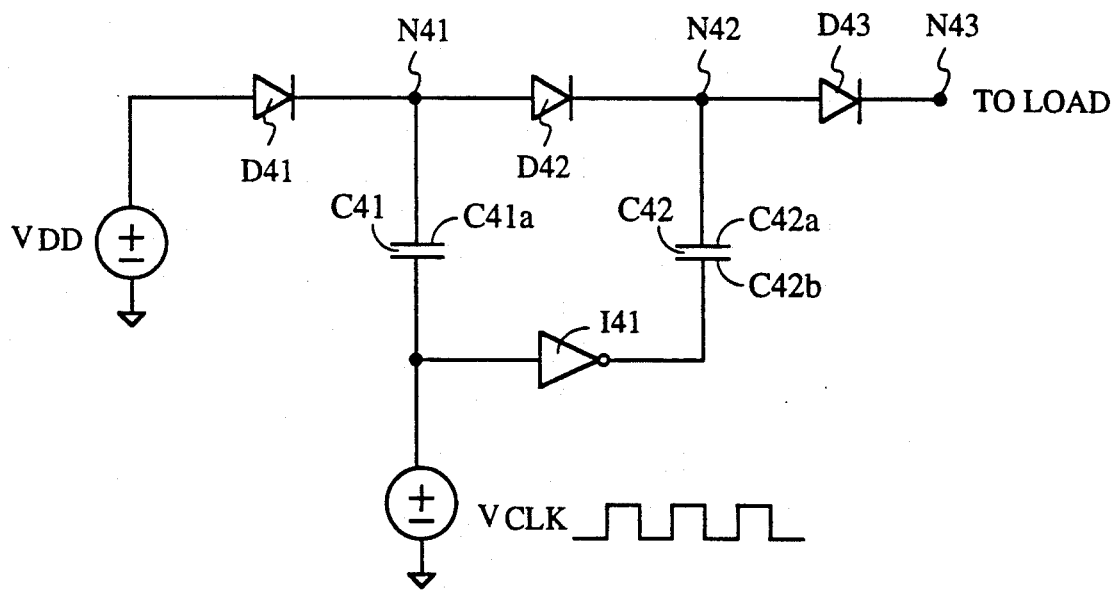

In contrast to prior art FIG. 2, the signal applied to plate C54b of capacitor C54 may be pumped or not pumped as determined by feedback from load output signal Vpp. Comparator U51 provides a logic high output signal when the voltage on its inverting input terminal is lower than a reference voltage VREF and a logic low otherwise. This comparator output signal is passed by latch L51 to its Q output terminal when its enable terminal encounters a logic high VCLK signal.

Because of inverter I51, a low signal is provided to input terminal A of NAND gate NAND51 when latch L51 is enabled and a high signal is provided when latch L51 is disabled. Thus a high Q output signal from latch L51 causes NAND gate NAND51 to pass the VCLK signal to capacitor C54, which in turn results in a pumped voltage at node N54, resulting in a higher voltage to node N55 than if capacitor C54 is not pumping. The peak voltage at node N55 is Vdd+2VCLK-VD54-VD55 when capacitor C54 is pumping. If the output of comparator U51 is a logic low, NAND gate NAND51 will provide a steady high signal to plate C54b, causing the peak voltage on node N55 to decrease toward Vdd+VCLK-VD54-VD55. This decrease allows a corresponding decrease at Vpp.

A switched capacitive voltage divider is provided between Vpp and the inverting input to comparator U51, comprising P-channel transistor TP51, capacitors C51 and C52 (along with comparator parasitic capacitance Cp) and N-channel transistors TN52 and TN53. P-channel transistor TP51, which operates in a higher voltage range has its well isolated and biased to the highest terminal voltage, which is the source voltage at Vpp. The gate of P-channel transistor TP51 is connected at node N55 to plate C55a of capacitor C55 at node N55, and receives the switching clock signal provided by VCLK through inverter 151 to plate C55b of capacitor C55. Thus transistor TP51 turns on any time node N55 is lower by more than a threshold drop than output voltage Vpp. Transistors TP51, TN52 and TN53 turn off at appropriate voltages so that no DC current path exists form Vpp to ground. When P-channel transistor TP51 is off, N-channel transistors TN52 and TN53 are on, and discharge their respective nodes N52 and N53 to ground voltage. During the other approximately half cycle, transistors TN52 and TN53 are off, and transistor TP51 is on, applying Vpp to node N52. If capacitor C51 is equal to capacitors C52+Cp, node N53 rises to half the voltage of node N52. During the half cycle transistor TP51 is on, the formula for voltage at node N53 is $$V_{N53} = Vpp(C51)/(C51+C52+Cp)$$

where
$V_{N53}$ is voltage at node N53
Vpp is voltage at the output node
C52 is capacitance of capacitor C52
C51 is capacitance of capacitor C51, and
Cp is parasitic capacitance of comparator U51, transistor TN53, and other effects of layout Also provided in the circuit of FIG. 3 is latch L52, whose output indicates that Vpp has reached the desired value. Latch L52 can be used to terminate a reset state which occurs at power-up. The $\overline{Q}$ output signal from latch L52, labeled READY, is held low until both the enable port EN of latch L52 is enabled by a high inverted clock signal (low VCLK) and a low signal is applied to the D input of latch L52 by the Q output of latch L51. This low Q output signal from L51, in turn, occurs only after the Vpp voltage has risen to its required level, thereby causing a low output signal from comparator U1.

Figure 4:
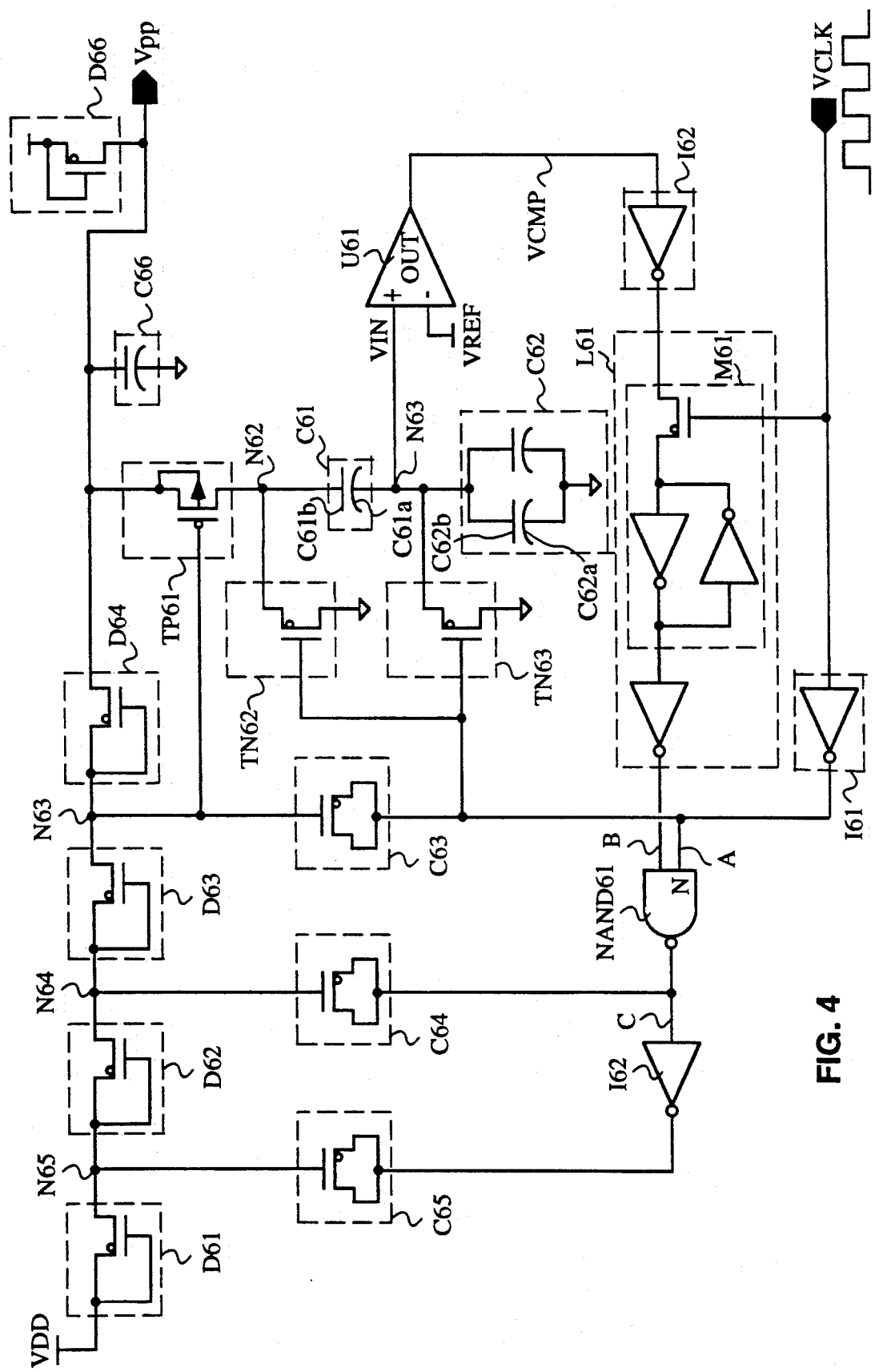
FIG. 4 shows another regulated voltage pump circuit which can benefit from the capacitor of the present invention.
Figure 5:
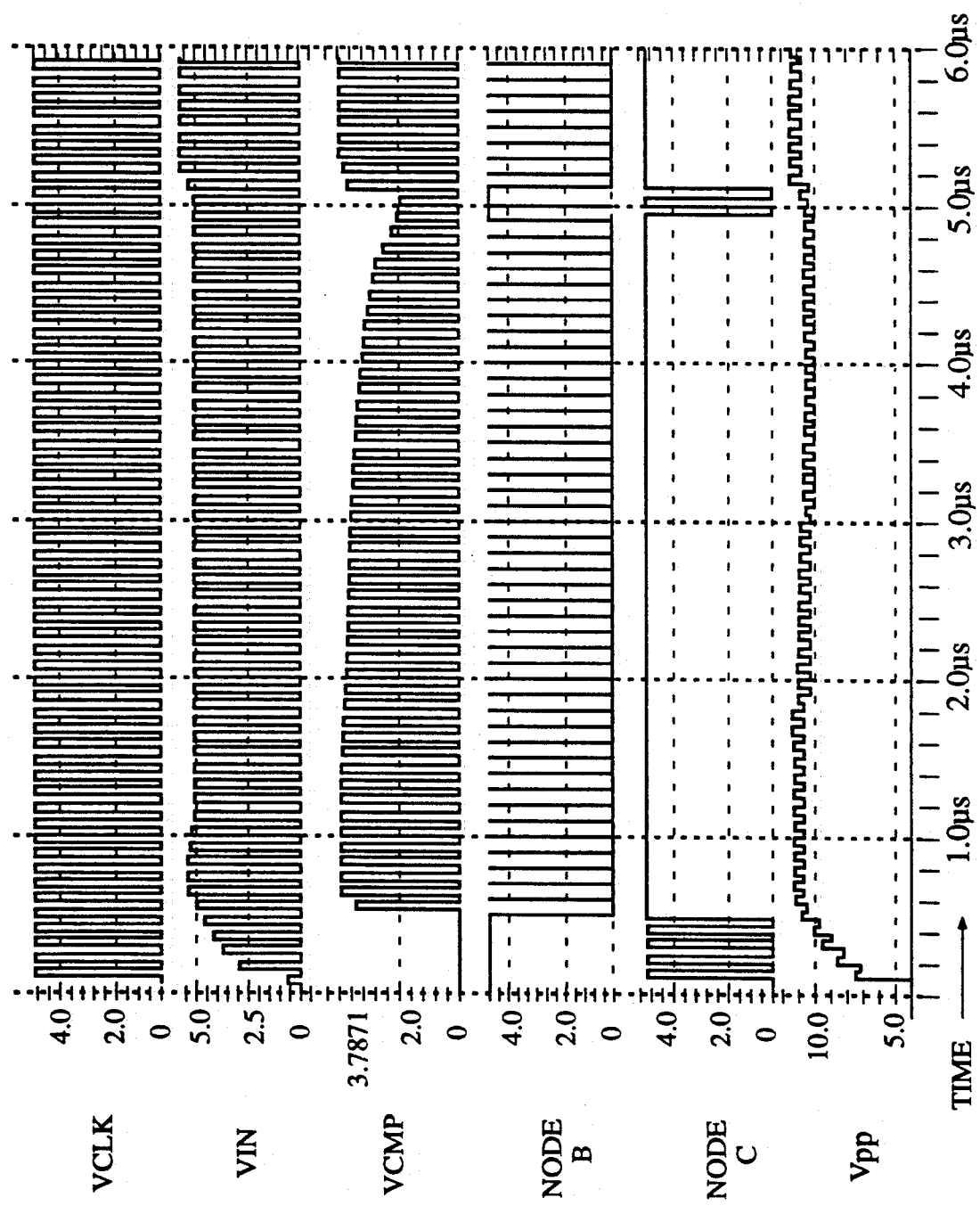
FIG. 5 shows a timing diagram for the circuit of FIG. 4.

Operation of the present invention can be better understood by reviewing the circuit embodiments of FIG. 4 in conjunction with its timing diagram shown in FIG. 5.

FIG. 4 shows a voltage pump which uses four diodes D61 through D64 in series, and controls the pumping between two pairs of the diodes D61 to D62 and D62 to D63. The diodes are formed as enhancement mode N-channel MOS transistors with the anode formed by connecting the drain of the transistor to the gate. In one embodiment which uses a 10 MHz clock frequency, long channel devices (length approximately 1.35 microns and width 80 microns) allow sufficient charge to bleed through every clock cycle. Because the pump diodes can have higher voltage than the Vpp output voltage, these pump diodes are manufactured to have higher breakdown voltages than other diodes and other transistors. This higher breakdown is achieved by creating the diode transistors as annular devices each having a lightly doped drain, with the drain completely surrounded by the gate but never touching the field oxide or field implant, and the gate completely surrounded by the source. Since the drain junction is completely surrounded by a lightly doped channel, the junction breakdown is significantly higher than if the drain were to border a more heavily doped field region.

Capacitors C65, C64, and C63, which pump nodes N65, N64, and N63 between diodes D61, D62, D63, and D64 respectively, are formed as enhancement mode NMOS transistors in which the oscillating capacitor plate is formed by connecting source and drain of the transistor, and the opposite capacitor plate is formed as the transistor gate.

NAND gate NAND61 is equivalent to NAND gate NAND51 of FIG. 3. Comparator U61 and inverter I62 are equivalent to comparator U51 of FIG. 5. Latch L61 is formed form a 5-transistor memory cell M61 (such as described by Hung-Cheng Hsieh in U.S. Pat. No. 4,750,155, the specification of which is incorporated herein by reference) with an inverter at its output. Capacitors C61 and C62 form a capacitive voltage divider, with output VIN divided from Vpp and provided at the intermediate node. The capacitors are preferably formed in a sandwich of conductive layers above the semiconductive substrate. The intermediate node at which VIN is generated is formed in a first layer of metal above a layer of polycrystalline silicon and beneath a second layer of metal. To minimize parasitic interconnected capacitance, the length of any metal connecting to the first metal node VIN is minimized. If Vpp should be twice VREF, the capacitance (size) of the capacitor connected to the transistor TP61 (capacitor C61) is made slightly larger than the capacitor connected to ground (capacitor C62), in order to take into account the parasitic capacitance between VIN and ground.

Sandwich Capacitors

Figure 6:
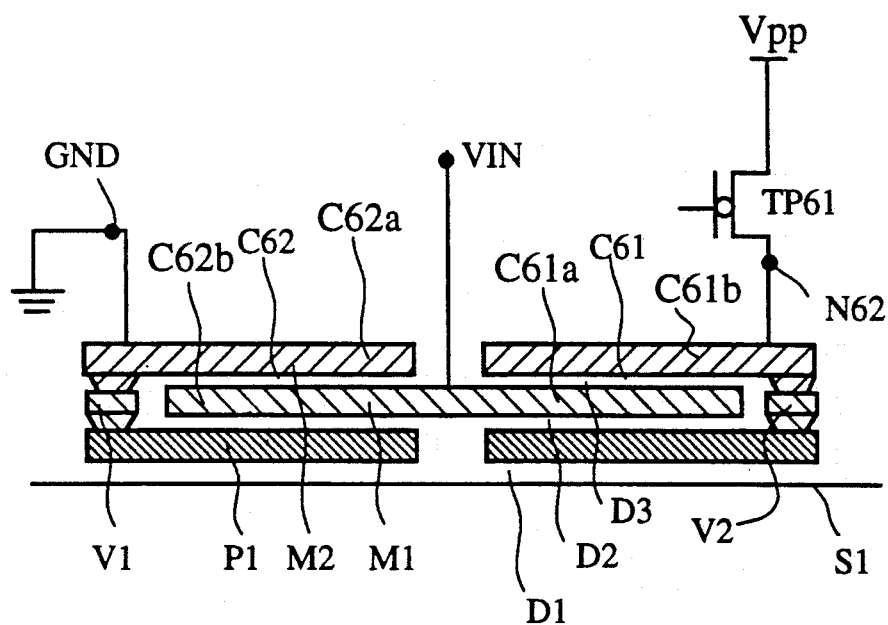
FIG. 6 shows a three-layer capacitor pair which comprises a preferred embodiment of the present invention.

In accordance with the present invention, capacitors C61 and C62 of FIG. 4 are formed in the sandwich arrangement shown in FIG. 6. Numerals in the upper portion of FIG. 6 corresponds to numerals in FIG. 4.

The capacitor arrangement of the invention may be used whenever the process technology includes three or more conductive layers. It is most beneficial when two capacitors share a common node, as is the case with capacitors C61 and C62 attached to common node N63. However, a single capacitor can also be formed according to the invention, either by forming the left or right half of FIG. 6 or by interconnecting both plates of the two capacitors shown.

The material in which the capacitors are formed comprises a six-layer structure above a semiconductive substrate S1. In order, the layers are dielectric layer D1, conductive polycrystalline silicon layer P1, dielectric layer D2, conductive metal layer M1, dielectric layer D3, and conductive metal layer M2.

In laying out capacitors C61 and C62 of FIG. 4, as shown in FIG. 6, plates C61a and C62b of capacitors C61 and C62 are formed as a single piece. Common node VIN and plates C61a and C62b are formed in metal 1. The other capacitor plates C61b and C62a are formed as a sandwich surrounding the common node. As shown in FIG. 6, each of plates C61b and C62a is formed partly in polycrystalline silicon layer P1 and partly in metal 2 above metal 1. The upper and lower portions of capacitor plate C62a are connected through via connection V1 which comprises a piece of metal 1 laterally spaced and insulated from the metal 1 capacitor plate C62b. Connection V1 extends downward through a via opening in the D2 dielectric layer, and contacts the lower portion of capacitor plate C62a. Another via in dielectric layer D3 allows the upper portion of plate C62a to contact via connection V1. Thus the upper metal 2 and lower metal 1 portions of capacitor plate C62a are connected to each other through via connection V1. This configuration achieves nearly double the capacitance per unit area of a capacitor formed in only two conductive layers. This benefit exists with capacitor C61 and C62. Doubling of capacitance per unit area occurs for each capacitor.

As a further advantage of the invention, the process parameters for the two capacitors will be very similar since the capacitors are very close to each other, and are formed in the same combination of layers. Therefore the ratio of the capacitance can be well controlled. Control of the relative capacitance is further well controlled because any stray capacitance which results from further metal lines passing nearby in metal 3, if it exists, will not affect the voltage at the common node VIN. More commonly, in a process using only two metal and one polycrystalline silicon layer, the formation of the two capacitors C61 and C62 in the three conductive layers prevents other conductive lines form being laid out above the structure, and thereby prevents or greatly reduces any stray capacitance.

In the embodiment of FIG. 4, if capacitor C61 is of equal value to capacitor C62 plus parasitic capacitance, Vpp will be twice VIN. Comparator U61 compares VIN to VREF. Thus Vpp will be twice VREF.

Initial Power-up

Also included in the circuit of FIG. 4 is a diode-connected transistor D66. This transistor provides a source of power to circuitry which is supplied by the Vpp signal. The circuitry is represented in FIG. 4 by capacitor C66, but may actually comprise an extensive logic circuit of many components. The capacitance of C66 is shown as 5 pF, but may be orders of magnitude higher in some applications. It is preferred in some applications that circuitry which will be powered by Vpp be initially powered through a large transistor D66, which can provide the supply voltage and can source higher current than the regulated circuit of FIG. 4.

Timing Diagram for Pump

FIG. 5 shows a timing diagram for the circuit of FIG. 4. The capacitive loading is represented by capacitor C66 as very small, 5 pF. This value was chosen for the stimulation represented in FIG. 5, so the operation of the circuit could be easily demonstrated by showing a small number of clock cycles. When the circuit turns on and the VCLK signal begins cycling, the noninverting input VIN to comparator U61 begins to cycle also, taking a few cycles (approximately 0.5 microseconds for the embodiment shown) to rise to its steady state value as Vpp begins to rise. Comparator U61 output signal VCMP is initially low while VIN is below VREF. During this time, input node B of NAND gate NAND61 remains high as driven by latch L61. Latch L61 carries a high signal during this time because it presents the high output signal from inverter I62, which inverts the low output signal VCMP.

While node B is high, the output at node C from NAND gate NAND61 switches in response to the inverted clock signal at node A. This switching signal at node C pumps the voltage at both nodes N65 an N64. The three pumped nodes N65, N64 and N63 cause a fast rise in the output voltage Vpp.

As shown in FIG. 5, after a period of about 4.5 microseconds, Vpp decreases to below 10 volts, which causes the voltage to be pumped higher. In the embodiment of FIG. 4, if capacitor C61 and capacitor C62 plus parasitics are of equal value, Vpp will be twice VREF. VREF is 5 volts. Therefore the pumping is initiated when Vpp goes below 10 volts, or VIN goes below 5 volts. Another value of VREF would in turn produce another value of Vpp. Another ratio of capacitors C61 and C62 would also produce a different value of Vpp. Capacitor C62 is shown as comprising two parallel capacitors, one of which results from the parasitic capacitance in the layout. In general, the relationship is $$Vpp = VREF*(C61 + C62 + Cp)/C61$$

where Cp is the parasitic capacitance associated with comparator U61, transistor TN63, and the layout arrangement of conductive lines.

In the present case, when Vpp decreases below 10 volts, VIN decreases below 5 volts. VCMP, which amplifies the variation in VIN decreases in this embodiment below 2.0 volts, which is the trigger point of inverter I62. Thus inverter I62 begins to generate a logical 1 output signal, which on the next cycle of VCLK causes latch L61 to generate a high output signal at node B. This high output signal on node B (which occurs at about 4.9 microseconds in FIG. 5) causes node C to again carry the (inverted) switching VCLK signal, again increasing the pumping of Vpp. Thus the Vpp output signal is maintained within a narrow range of the intended voltage.

The particular load attached to Vpp to generate the timing diagram of FIG. 5 allows the voltage to be pumped sufficiently in only two clock cycles. A larger load at Vpp would cause the voltage at Vpp to decrease faster and would require a somewhat longer pumping signal at node C to restore the voltage at Vpp. The size of the regulator capacitors and any parasitic capacitance also affects the pumping time.

Figure 7:
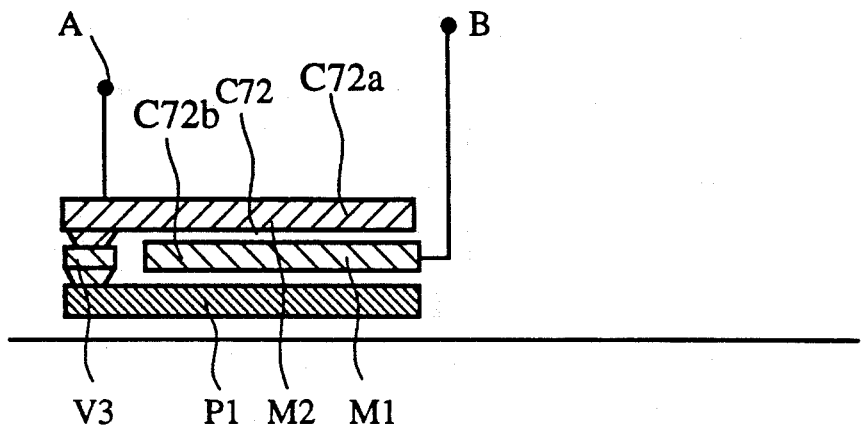
FIG. 7 shows an embodiment of invention which forms a single capacitor.

FIG. 7 shows a single capacitor embodiment of the present invention. In this embodiment, capacitor C72 is formed in three layers, plate C72a being formed in second metal layer M2 and polycrystalline silicon layer P1 with an interconnecting via V3 in metal layer M1. The second capacitor plate C72b is formed in first metal layer M1. This capacitor also achieves the benefit of approximately doubling the capacitance per unit area.

Figure 8:
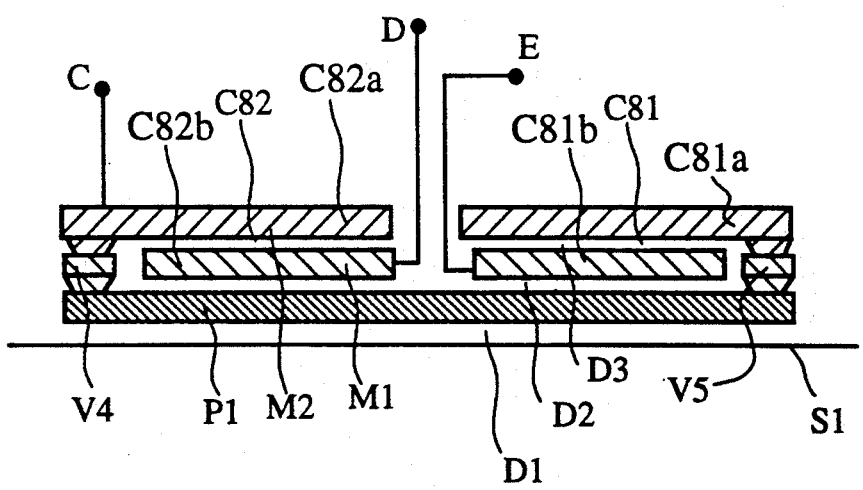
FIG. 8 shows an alternate embodiment which forms a pair of capacitors.

FIG. 8 shows a third embodiment, again comprising a pair of capacitors C81 and C82, again formed in three layers. However, the capacitor structure of FIG. 8 provides two electrically isolated capacitor plates C81b and C82b formed in the first layer of metal M1 and a common capacitor plate C81a and C82a formed primarily in polycrystalline silicon layer P1 and metal layer M2.

In light of the above description, other embodiments of the present invention will become obvious to those skilled in the art. Such embodiments are intended to fall within the scope of the claims.

We claim:

1. A sandwich capacitor formed above a semiconductor substrate comprising:
   a polysilicon layer;
   a first metal layer formed above said polysilicon layer;
   a second metal layer formed above said polysilicon layer;
   said polysilicon and metal layers being separated form each other by insulating layers;
   a first capacitor plate formed in said first metal layer;
   a second capacitor plate formed in portions of said polysilicon and second metal layers which are below and above said first capacitor plate and from a portion of said first metal layer electrically isolated form said first capacitor plate.

2. A pair of sandwich capacitors, each formed as in claim 1, said first capacitor plates of each of said pair being interconnected.

3. A pair of sandwich capacitors as in claim 2, said second capacitor plates of said pair being interconnected.

4. A pair of sandwich capacitors as in claim 2, said second capacitor plates of said pair being electrically isolated from each other.

5. A pair of sandwich capacitors formed above a semiconductor substrate comprising:
   a first conductive layer;
   a second conductive layer formed above said first conductive layer;
   a third conductive layer formed above said second conductive layer;
   said conductive layers being separated from each other by insulating layers;
   a pair of first capacitor plates each formed in said second conductive layer and electrically connected to each other; and
   a pair of second capacitor plates each formed in portions of said first and third conductive layers which are below and above said first capacitor plate and from portions of said second conductive layer electrically isolated from said first capacitor plates, said second capacitor plates being electrically isolated from each other.

* * * * *

UNITED STATES PATENT AND TRADEMARK OFFICE
CERTIFICATE OF CORRECTION

PATENT NO. : 5,166,858
DATED : November 24, 1992
INVENTOR(S) : Scott O. Frake, Roger D. Carpenter It is certified that error appears in the above-identified patent and that said Letters Patent is hereby corrected as shown below:

Col. 1, line 14, "rougly", should read --roughly--.

Col. 4, line 57, "interconnected", should read --interconnect--.

Col. 5, line 54, "form", should read --from--.

Col. 6, line 55, the first "162", should read --I62--.

Col. 6, line 55, the second "162, should read --I62--.

Col. 7, line 33, "form", should read --from--.

Col. 8, line 5, "form", should read --from--.

Signed and Sealed this

Tenth Day of May, 1994

Attest:

BRUCE LEHMAN

Attesting Officer

Commissioner of Patents and Trademarks